(12) United States Patent
Sato

(10) Patent No.: US 10,090,248 B2
(45) Date of Patent: Oct. 2, 2018

(54) CONDUCTIVE STRUCTURE AND MANUFACTURING METHOD THEREOF, AND ELECTRONIC DEVICE AND MANUFACTURING METHOD THEREOF

(71) Applicant: FUJITSU LIMITED, Kawasaki-shi, Kanagawa (JP)

(72) Inventor: Motonobu Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/976,595

(22) Filed: Dec. 21, 2015

(65) Prior Publication Data

US 2016/0172305 A1 Jun. 16, 2016

Related U.S. Application Data

(63) Continuation of application No. PCT/JP2014/051773, filed on Jan. 28, 2014.

(30) Foreign Application Priority Data

Jun. 21, 2013 (JP) .................................. 2013-130840

(51) Int. Cl.
*H01L 23/00* (2006.01)
*H01L 23/532* (2006.01)
(Continued)

(52) U.S. Cl.
CPC ........ *H01L 23/53276* (2013.01); *B82Y 10/00* (2013.01); *H01L 21/76804* (2013.01);
(Continued)

(58) Field of Classification Search
CPC ......... H01L 21/76802; H01L 21/76804; H01L 21/7684; H01L 21/76879; H01L 21/7688;
(Continued)

(56) References Cited

U.S. PATENT DOCUMENTS

2005/0067693 A1 3/2005 Nihei
2010/0316558 A1* 12/2010 Kawabata .............. B82Y 10/00
423/447.1
(Continued)

FOREIGN PATENT DOCUMENTS

JP H03-227590 10/1991
JP 2005-109133 A1 4/2005
(Continued)

OTHER PUBLICATIONS

Office Action of Taiwanese Patent Application No. 103103502 dated May 25, 2015 (9 Sheets, 7 Sheets translation, 16 Sheets total).
(Continued)

*Primary Examiner* — Armando Rodriguez
(74) *Attorney, Agent, or Firm* — Kratz, Quintos & Hanson, LLP

(57) ABSTRACT

An opening is formed in an insulating film being a formation site, vertical and parallel CNTs are formed, tip portions of the CNTs are inserted into the opening, and the CNTs are removed except for the tip portions inserted into the opening. With this configuration, a desired conductive structure with high reliability is realized by forming high-quality CNTs in an opening of a formation site without depending on a base material.

9 Claims, 14 Drawing Sheets

(51) Int. Cl.
      H01L 23/48     (2006.01)
      H01L 23/522    (2006.01)
      H01L 29/78     (2006.01)
      B82Y 10/00     (2011.01)
      H01L 29/772    (2006.01)
      H01L 29/41     (2006.01)
      H01L 21/768    (2006.01)
      H01L 23/485    (2006.01)
      H01L 25/065    (2006.01)
      H01L 29/06     (2006.01)
      H01L 29/16     (2006.01)
      C01B 32/16     (2017.01)

(52) U.S. Cl.
      CPC .. *H01L 21/76879* (2013.01); *H01L 21/76885* (2013.01); *H01L 21/76898* (2013.01); *H01L 23/481* (2013.01); *H01L 23/485* (2013.01); *H01L 23/522* (2013.01); *H01L 23/5226* (2013.01); *H01L 25/0657* (2013.01); *H01L 29/413* (2013.01); *H01L 29/772* (2013.01); *H01L 29/78* (2013.01); *C01B 32/16* (2017.08); *C01B 2202/08* (2013.01); *H01L 29/0676* (2013.01); *H01L 29/1606* (2013.01); *H01L 2221/1094* (2013.01); *H01L 2225/06513* (2013.01); *H01L 2225/06541* (2013.01); *H01L 2924/0002* (2013.01)

(58) Field of Classification Search
      CPC ......... H01L 21/76883; H01L 21/76885; H01L 21/76898; H01L 23/53276; H01L 23/481; H01L 23/485; H01L 23/522; H01L 23/5226; H01L 23/528; H01L 25/0657; H01L 29/413; H01L 29/78
      See application file for complete search history.

(56)              References Cited

U.S. PATENT DOCUMENTS

2010/0317187  A1      12/2010  Kawabata
      2012/0049370  A1*      3/2012  Wada ................... B82Y 10/00
                                                             257/751

FOREIGN PATENT DOCUMENTS

JP         2007-26839 A1      2/2007
      JP         2010-177405 A1     8/2010
      WO     WO 2007/111107 A1     10/2007

OTHER PUBLICATIONS

Written Opinion of the International Searching Authority for International Application No. PCT/JP2014/051773 dated May 13, 2014 (6 Sheets total).

International Search Report for International Application No. PCT/JP2014/051773 dated May 13, 2014.

* cited by examiner

CONDUCTIVE STRUCTURE AND MANUFACTURING METHOD THEREOF, AND ELECTRONIC DEVICE AND MANUFACTURING METHOD THEREOF

CROSS-REFERENCE TO RELATED APPLICATIONS

This application is a continuation application of International Application PCT/JP2014/051773 filed on Jan. 28, 2014, and designated the U.S., which claims the benefit of priority of the prior Japanese Patent Application No. 2013-130840, filed on Jun. 21, 2013, the entire contents of which are incorporated herein by reference.

FIELD

The embodiments discussed herein are directed to a conductive structure and a manufacturing method thereof, and an electronic device and a manufacturing method thereof.

BACKGROUND

Conventionally, metal materials of W, Cu, and the like have been mainly used for contact portions electrically connecting a functional element of a transistor or the like and a wiring, via portions electrically connecting wirings at a position above a functional element, and further, TSVs electrically connecting three-dimensionally stacked semiconductor chips, and the like. Nowadays, as an alternative to the above-described metal materials, a carbon-based material such as carbon nanotubes (CNTs) is drawing an attention. The CNT is regarded as a promising material having a low resistivity, a high current density resistance, and a high thermal conductivity.

Patent Document 1: Japanese Laid-open Patent Publication No. 2007-26839

SUMMARY

As a method of forming CNTs in an opening of an insulating film to obtain a conductive structure, there is a method in which CNTs are vertically grown from a bottom surface of an opening such as a contact hole, a via hole, or the like (refer to Patent Document 1).

However, a growth condition of the CNTs strongly depends on a base substrate material and a base catalytic material, and further, a high growth temperature becomes necessary for obtaining high-quality CNTs. For this reason, it is difficult, in a substrate on which an electronic element of a transistor or the like is provided, to make high-quality CNTs directly grow in an opening of an insulating film formed on the substrate.

A manufacturing method of a conductive structure of the present embodiment includes: forming an opening in a formation site; forming vertical and parallel carbon nanotubes; inserting tip portions of the carbon nanotubes into the opening; and removing the carbon nanotubes except for the tip portions inserted into the opening.

A conductive structure of the present embodiment includes: a formation site in which an opening having an upper portion whose opening diameter is enlarged in a tapered state is formed; and carbon nanotubes filling the opening.

A manufacturing method of an electronic device of the present embodiment includes: forming a functional element on a substrate; and forming conductive structures electrically connected to the functional element, in which the formation of the conductive structures includes: forming openings in a formation site; forming vertical and parallel carbon nanotubes; inserting tip portions of the carbon nanotubes into the openings; and removing the carbon nanotubes except for the tip portions inserted into the openings.

An electronic device of the present embodiment includes: a functional element formed on a substrate; and conductive structures electrically connected to the functional element, in which the conductive structures include: a formation site in which openings each having an upper portion whose opening diameter is enlarged in a tapered state are formed; and carbon nanotubes which fill the openings.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

Figure 1A:
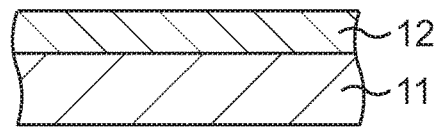
FIG. 1A is a schematic sectional view illustrating a manufacturing method of a conductive structure according to a first embodiment in order of processes.

Hereinafter, a conductive structure and a manufacturing method thereof according to a first embodiment will be described in detail while referring to the drawings.

FIG. 1A to FIG. 3C are schematic sectional views illustrating the manufacturing method of the conductive structure according to the first embodiment in order of processes.

First, an oxide film 12 is formed on a substrate 11, as illustrated in FIG. 1A.

As the substrate 11, a Si substrate is prepared, for example. It is also possible to use a SiC substrate, various insulating substrates, or the like, instead of the Si substrate.

On the substrate 11, a silicon oxide film, for example, is deposited by using a CVD method or the like. Consequently, the oxide film 12 is formed.

Figure 1B:
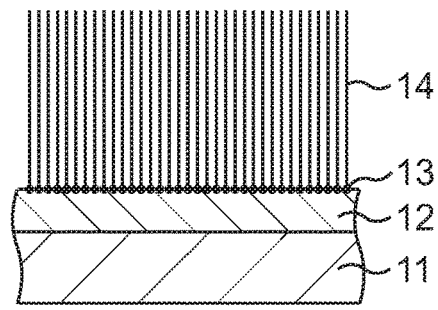
FIG. 1B is a schematic sectional view illustrating the manufacturing method of the conductive structure according to the first embodiment in order of processes continued from FIG. 1A.

Subsequently, CNTs 14 are grown on the oxide film 12, as illustrated in FIG. 1B.

Specifically, at first, a vacuum deposition method or the like is used to deposit a catalytic material, on the oxide film 12, to have a thickness of about several nm, for example. As the catalytic material, there is used a material of one kind or two kinds or more selected from Co, Ni, Fe, Al, and the like, or a mixed material of the above-described one kind or two kinds or more, and one kind or two kinds or more selected from Ti, TiN, $TiO_2$, V, and the like. For example, Co/Ti or Co/V is selected. Consequently, a catalytic material 13 is formed on the oxide film 12.

Next, a thermal CVD method, for example, is used to set a growth temperature to equal to or less than a sublimation temperature of a substrate material and a catalytic material, here, about 800° C., for example, to thereby carry out a growth process of carbon nanotubes (CNTs). Consequently, a plurality of pieces of CNTs 14 are formed in parallel, so as to be vertical, from the catalytic material 13 which exists on the oxide film 12.

Figure 1C:
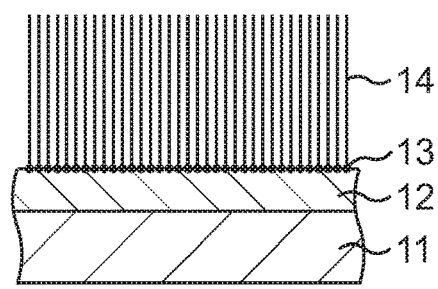
FIG. 1C is a schematic sectional view illustrating the manufacturing method of the conductive structure according to the first embodiment in order of processes continued from FIG. 1B.

Subsequently, upper ends of the CNTs 14 are planarized, as illustrated in FIG. 1C.

Specifically, the upper ends of the CNTs 14 are planarized by being pressed against a previously planarized supporting substrate or the like.

Figure 1D:
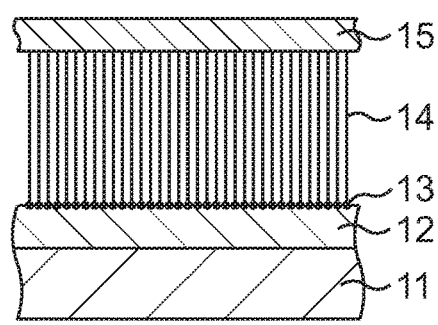
FIG. 1D is a schematic sectional view illustrating the manufacturing method of the conductive structure according to the first embodiment in order of processes continued from FIG. 1C.

Subsequently, a transfer support film 15 is formed on the planarized upper ends of the CNTs 14, as illustrated in FIG. 1D.

Specifically, a metal film, an insulating film or the like, here, Au is deposited on the planarized upper ends of the CNTs 14, by using a sputtering method, for example. Consequently, the transfer support film 15 is formed.

Figure 2A:
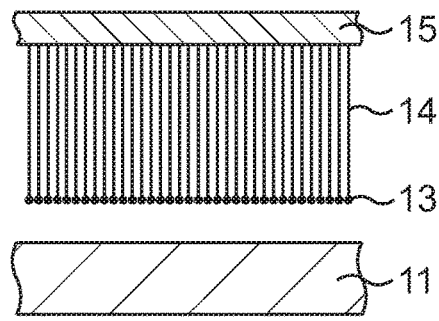
FIG. 2A is a schematic sectional view illustrating the manufacturing method of the conductive structure according to the first embodiment in order of processes continued from FIG. 1D.

Subsequently, the substrate 11 is removed together with the oxide film 12, as illustrated in FIG. 2A.

Specifically, buffered hydrofluoric acid (BHF) or the like is used to make the oxide film 12 separate from the catalytic material 13 on which the CNTs 14 are formed. Consequently, the substrate 11 is removed together with the oxide film 12.

Figure 2B:
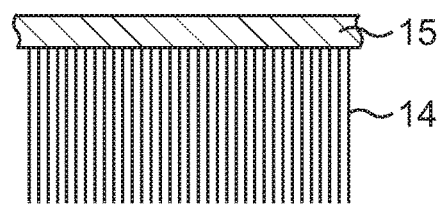
FIG. 2B is a schematic sectional view illustrating the manufacturing method of the conductive structure according to the first embodiment in order of processes continued from FIG. 2A.

Subsequently, the catalytic material 13 is removed, as illustrated in FIG. 2B.

Specifically, the catalytic material 13 is treated by using a chemical solution of FeCl$_3$ aqueous solution, HCl or the like. Consequently, the catalytic material 13 is removed from the CNTs 14. Note that it is also possible that after the catalytic material 13 is removed, a metal or the like is deposited on the tips of the CNTs 14 as a joining material. Further, it is also possible to perform the joining without removing the catalytic material 13.

Figure 2C:
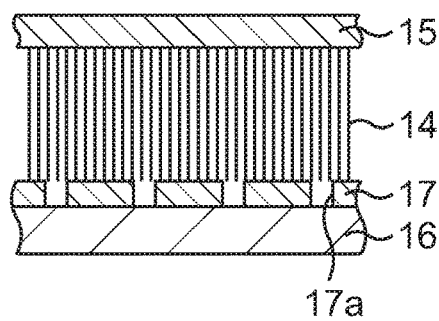
FIG. 2C is a schematic sectional view illustrating the manufacturing method of the conductive structure according to the first embodiment in order of processes continued from FIG. 2B.

Subsequently, a substrate 16 and the transfer support film 15 are made to face each other, as illustrated in FIG. 2C.

Specifically, at first, the substrate 16 being a semiconductor substrate or the like is prepared, and an insulating film 17 is formed on (or above) the substrate 16. The insulating film 17 is a silicon oxide film, for example, and is formed by using the CVD method or the like.

Next, openings 17a are formed in predetermined portions of the insulating film 17. The openings 17a are formed by performing processing on the insulating film 17 through lithography and dry etching.

Next, a volatile solvent is applied to a portion between the substrate 16 and the transfer support film 15 which are faced each other. As the volatile solvent, acetone, ethanol or the like is used. Alternatively, it is also possible to use a metal nanoparticle dispersion liquid.

Figure 2D:
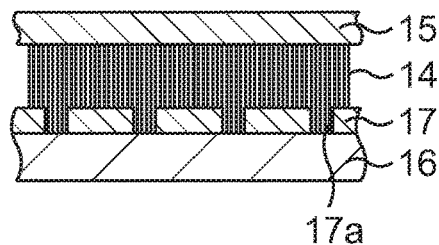
FIG. 2D is a schematic sectional view illustrating the manufacturing method of the conductive structure according to the first embodiment in order of processes continued from FIG. 2C.

Subsequently, the applied volatile solvent is dried. It is also possible to perform, after the drying is finished, pressure bonding using a press machine or the like. When the applied volatile solvent is dried, the transfer support film 15 comes into close contact with the substrate 16, resulting in that the insulating film 17 and the CNTs 14 come into close contact with each other, as illustrated in FIG. 2D. Tip portions of the CNTs 14 are inserted into the openings 17a, and are connected to bottom surfaces of the openings 17a.

Figure 3A:
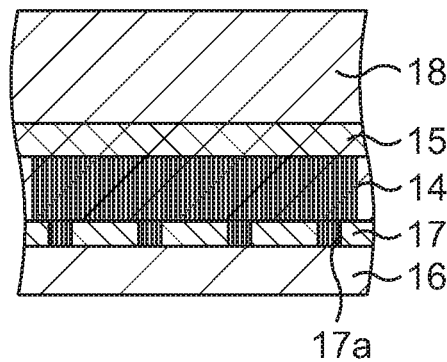
FIG. 3A is a schematic sectional view illustrating the manufacturing method of the conductive structure according to the first embodiment in order of processes continued from FIG. 2D.

Subsequently, a SOG 18 is applied, as illustrated in FIG. 3A, and CMP (Chemical-Mechanical Polishing) is performed. Specifically, the SOG 18, the transfer support film 15, and unnecessary CNTs 14 are polished except for the tip portions of the CNTs 14 which exist in the openings 17a. It is also possible to use a metal nanoparticle paste or the like, instead of the SOG 18.

Figure 3B:
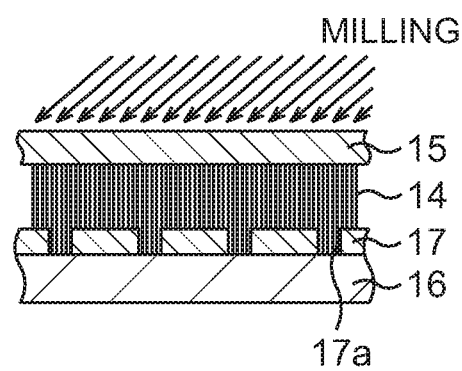
FIG. 3B is a schematic sectional view illustrating the manufacturing method of the conductive structure according to the first embodiment in order of processes continued from FIG. 3A.

Alternatively, it is also possible to design such that the transfer support film 15 is removed, and the unnecessary CNTs 14 are successively removed as illustrated in FIG. 3B, as an alternative method of the process in FIG. 3A.

Specifically, ion milling or the like is performed on the transfer support film 15, to separate the transfer support film 15 from the CNTs 14. Consequently, the transfer support film 15 is removed. Subsequently, the ion milling or the like is performed on the CNTs 14 protruding from the surface of the insulating film 17 except for the tip portions of the CNTs 14 which exist in the openings 17a. Consequently, the portions (unnecessary portions) of the CNTs 14 protruding from the surface of the insulating film 17 are removed.

Figure 3C:
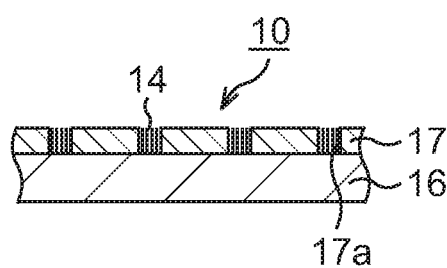
FIG. 3C is a schematic sectional view illustrating the manufacturing method of the conductive structure according to the first embodiment in order of processes continued from FIG. 3B.

In the manner as described above, there is formed a conductive structure 10 realized by filling the openings 17a of the insulating film 17 with the CNTs 14, as illustrated in FIG. 3C.

As described above, according to the present embodiment, it is possible to realize the desired conductive structure 10 with high reliability by forming the high-quality CNTs 14 in the openings 17a of the insulating film 17 without depending on the base catalytic material.

Second Embodiment

Hereinafter, a conductive structure and a manufacturing method thereof according to a second embodiment will be described in detail while referring to the drawings.

FIG. 4A to FIG. 7B are schematic sectional views illustrating the manufacturing method of the conductive structure according to the second embodiment in order of processes.

Figure 4A:
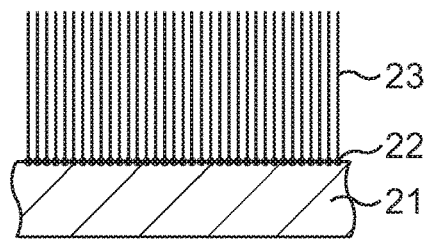
FIG. 4A is a schematic sectional view illustrating a manufacturing method of a conductive structure according to a second embodiment in order of processes.

First, CNTs 23 are grown on a supporting substrate 21, as illustrated in FIG. 4A.

Specifically, a Si substrate, for example, is first prepared as the supporting substrate 21. It is also possible to use a SiC substrate, various insulating substrates, or the like, instead of the Si substrate.

Next, the vacuum deposition method or the like is used to deposit a catalytic material, on the supporting substrate 21, to have a thickness of about several nm, for example. As the catalytic material, there is used a material of one kind or two kinds or more selected from Co, Ni, Fe, Al, and the like, or a mixed material of the above-described one kind or two kinds or more, and one kind or two kinds or more selected from Ti, TiN, TiO$_2$, V, and the like. For example, Co/Ti or Co/V is selected. Consequently, a catalytic material 22 is formed on the supporting substrate 21.

Next, the thermal CVD method, for example, is used to set a growth temperature to equal to or less than a sublimation temperature of a substrate material and a catalytic material, here, about 800° C., for example, to thereby carry out a growth process of carbon nanotubes (CNTs). Consequently, a plurality of pieces of CNTs 23 are formed in parallel, so as to be vertical, from the catalytic material 22 which exists on the supporting substrate 21. The CNTs 23 are formed at a density of about $1\times10^{12}$ (piece/cm$^2$), for example.

Figure 4B:
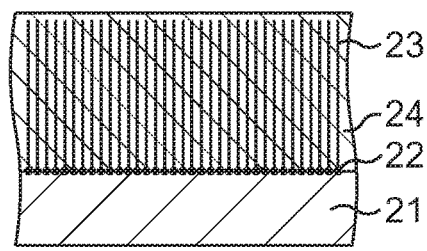
FIG. 4B is a schematic sectional view illustrating the manufacturing method of the conductive structure according to the second embodiment in order of processes continued from FIG. 4A.

Subsequently, a resist 24 is formed on the CNTs 23, as illustrated in FIG. 4B.

Specifically, a resist is applied so as to cover all of the CNTs 23 (so as to bury the CNTs 23). Consequently, the resist 24 is formed.

Figure 4C:
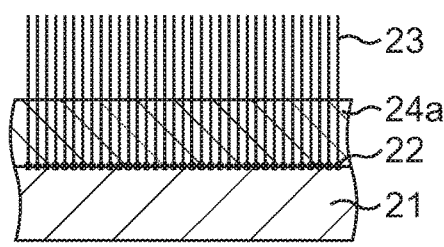
FIG. 4C is a schematic sectional view illustrating the manufacturing method of the conductive structure according to the second embodiment in order of processes continued from FIG. 4B.

Subsequently, a resist mask 24a is formed, as illustrated in FIG. 4C.

Specifically, the resist 24 is subjected to wet treatment for a predetermined time by using a chemical solution of acetone, ethanol, IPA, NMP or the like, to thereby remove the resist on the surface. It is also possible to perform the wet treatment and drying thereafter in a continuous manner by using a spin coater or the like. By this treatment, the resist 24 is selectively etched, resulting in that the resist mask 24a covering the CNTs 23 from lower ends of the CNTs 23 to a predetermined height, is formed.

Figure 4D:
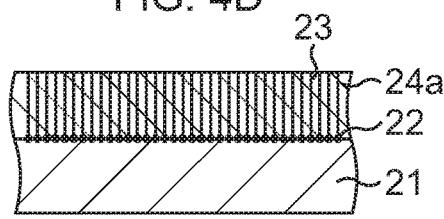
FIG. 4D is a schematic sectional view illustrating the manufacturing method of the conductive structure according to the second embodiment in order of processes continued from FIG. 4C.

Subsequently, the CNTs 23 are adjusted to have a short length, as illustrated in FIG. 4D.

Specifically, the ion milling or asking is performed on portions of the CNTs 23 exposed from the resist mask 24a. Consequently, the portions of the CNTs 23 are removed, resulting in that the CNTs 23 are adjusted to have a desired length defined by the height of the resist mask 24a.

Figure 4E:
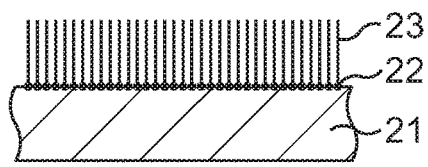
FIG. 4E is a schematic sectional view illustrating the manufacturing method of the conductive structure according to the second embodiment in order of processes continued from FIG. 4D.

Subsequently, the resist mask 24a is removed, as illustrated in FIG. 4E.

Specifically, the resist mask 24a is subjected to wet treatment using a chemical solution of acetone or the like. By this treatment, the resist mask 24a is selectively etched to be removed from the CNTs 23.

In the present embodiment, the length of the grown CNTs 23 is adjusted to be decreased to be a desired length. Consequently, when the CNTs 23 are inserted into an opening of an insulating film as will be described later, it is possible to insert the CNTs 23 into the opening in an approximately upright state, without allowing the CNTs 23 to fall or bend.

Figure 8:
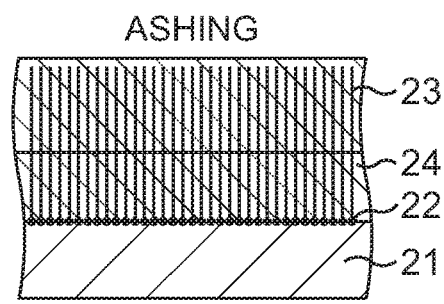
FIG. 8 is a schematic sectional view illustrating another example of the manufacturing method of the conductive structure according to the second embodiment.

Note that it is also possible to carry out a process in FIG. 8, instead of the processes in FIG. 4C and FIG. 4D.

Specifically, in a state where the resist 24 covering all of the CNTs 23 is formed, the ashing is performed not only on upper portions of the CNTs 23 but also on an upper portion of the resist 24. By controlling a time and the like of the ashing, the upper portions of the CNTs 23 together with the upper portion of the resist 24 are subjected to the ashing, resulting in that the CNTs 23 and the resist 24 with a desired height are remained. Thereafter, the resist 24 is removed in a process similar to that in FIG. 4E.

It is also possible that the respective processes in FIG. 4B to FIG. 4E, or the respective processes in FIG. 4B, FIG. 8, and FIG. 4E are applied to the CNTs 14 in FIG. 1B in the first embodiment, and the length of the grown CNTs 14 is adjusted to be decreased to be a desired length.

Figure 5A:
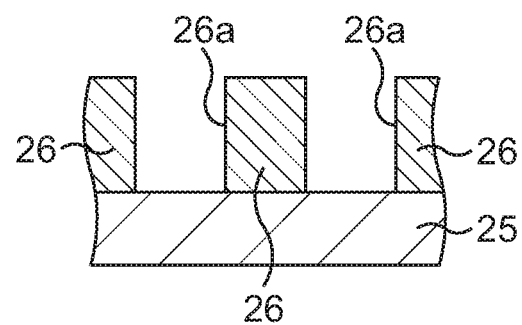
FIG. 5A is a schematic sectional view illustrating the manufacturing method of the conductive structure according to the second embodiment in order of processes continued from FIG. 4E.

Subsequently, openings 26a are formed in an insulating film 26 on a substrate 25, as illustrated in FIG. 5A.

Specifically, at first, the substrate 25 being a Si substrate or the like is prepared, and the insulating film 26 is formed on (or above) the substrate 25. The insulating film 26 is a silicon oxide film, for example, and is formed by using the CVD method or the like.

Next, the openings 26a are formed in predetermined portions of the insulating film 26. The openings 26a are formed by performing processing on the insulating film 26 through the lithography and the dry etching.

Figure 5B:
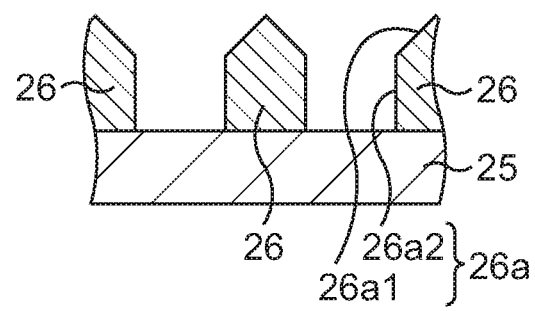
FIG. 5B is a schematic sectional view illustrating the manufacturing method of the conductive structure according to the second embodiment in order of processes continued from FIG. 5A.

Subsequently, an upper portion of each of the openings 26a is processed in a tapered state to enlarge an opening diameter, as illustrated in FIG. 5B.

Specifically, the ion milling is performed, from a diagonal direction, on the openings 26a of the insulating film 26. Consequently, an upper portion 26a1 of the opening 26a is formed in a tapered state, resulting in that an opening diameter of the upper portion 26a1 is enlarged to become larger than an opening diameter of a lower portion (a vertical wall portion of the opening 26a) 26a2.

Figure 5C:
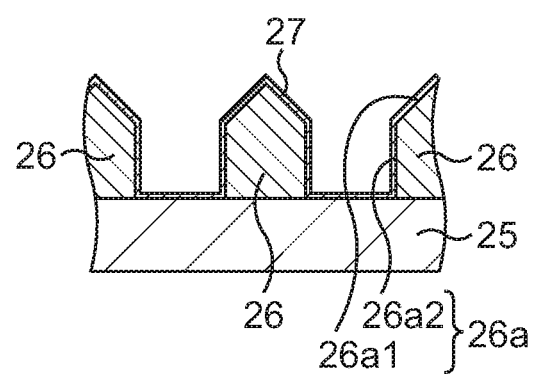
FIG. 5C is a schematic sectional view illustrating the manufacturing method of the conductive structure according to the second embodiment in order of processes continued from FIG. 5B.

Subsequently, a base metal film 27 is formed, as illustrated in FIG. 5C.

Specifically, on the insulating film 26, a metal, for example, a barrier metal of Ti, TiN, Ta, TaN or the like, or a contact metal of Au, Pd, In or the like for realizing electrical connection with CNTs, is deposited so as to cover an internal surface of the openings 26a, by using the sputtering method or the like. Consequently, the base metal film 27 is formed.

Figure 6A:
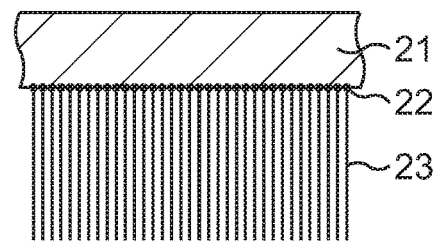
FIG. 6A is a schematic sectional view illustrating the manufacturing method of the conductive structure according to the second embodiment in order of processes continued from FIG. 5C.

Subsequently, the substrate 25 and the supporting substrate 21 are made to face each other, as illustrated in FIG. 6A.

Specifically, the substrate 25 and the supporting substrate 21 are made to face each other so that tips of the CNTs 23 and the surface of the insulating film 26 are confronted.

Figure 6B:
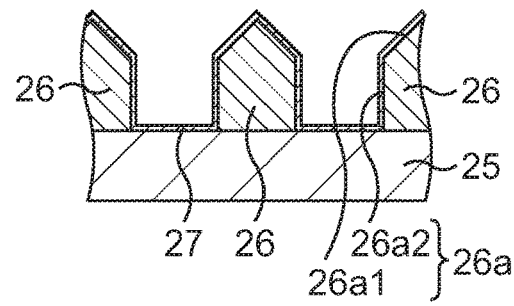
FIG. 6B is a schematic sectional view illustrating the manufacturing method of the conductive structure according to the second embodiment in order of processes continued from FIG. 6A.

Subsequently, the tip portions of the CNTs 23 are inserted into the openings 26a to be pressure-bonded, as illustrated in FIG. 6B.

Specifically, the tip portions of the CNTs 23 are inserted into the openings 26a of the insulating film 26 until they reach bottom surfaces of the openings, and are pressure-bonded. It is also possible to perform, in this state, annealing treatment at about 400° C. for reducing a contact resistance. Consequently, the tips of the CNTs 23 are pressure-bonded and connected to the bottom surfaces of the openings 26a. It is also possible to design such that a metal of Au or the like is applied to the tips of the CNTs 23 in a state of FIG. 6A, to thereby increase, with the use of the metal, a connectivity of the tips of the CNTs 23 with the bottom surfaces of the openings 26a.

When performing the pressure-bonding and connection, not only portions of the tip portions of the CNTs 23 corresponding to the lower portions 26a2, but also portions adjacent to the above portions of the tip portions of the CNTs 23 are pushed into the openings 26a, because of the existence of the upper portions 26a1 of the openings 26a. Consequently, a density of the CNTs 23 in the openings 26a becomes higher than the density of the CNTs 23 in the state of FIG. 6A.

Figure 9A:
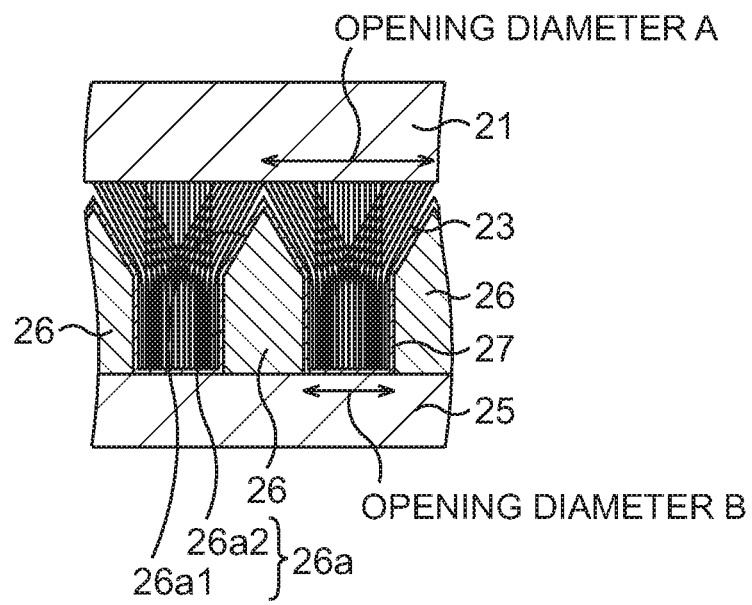
FIG. 9A is a schematic sectional view illustrating a concrete example of FIG. 6B in the manufacturing method of the conductive structure according to the second embodiment.
Figure 9B:
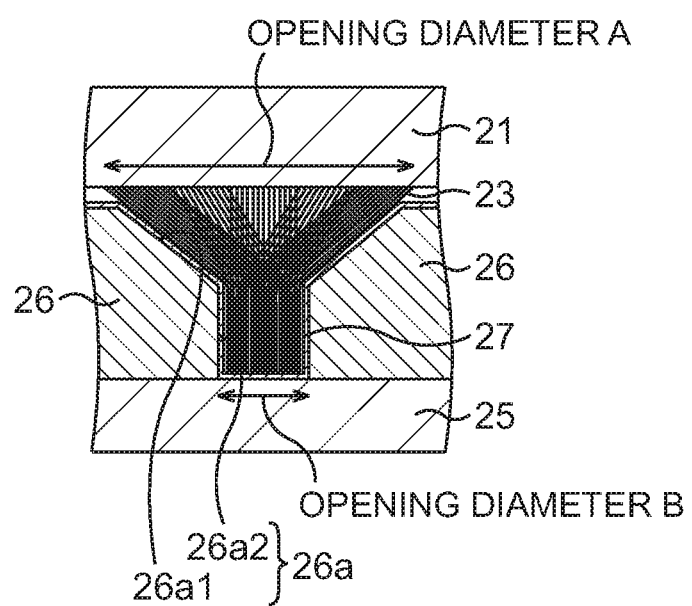
FIG. 9B is a schematic sectional view illustrating a concrete example of FIG. 6B in the manufacturing method of the conductive structure according to the second embodiment.

Concrete examples of FIG. 6B are illustrated in FIG. 9A and FIG. 9B. FIG. 9A illustrates a case where the openings 26a are densely formed in a ratio of one to one in the insulating film 26, and FIG. 9B illustrates a case where the opening 26a is formed, in an isolated manner, in the insulating film 26.

In FIG. 9A, a density of the CNTs 23 in the lower portion 26a2 of each of the openings 26a is increased to about at least four times a density of the CNTs 23 in the state of FIG. 6A, namely, it is increased to about $4 \times 10^{12}$ (piece/cm$^2$), resulting in that it becomes possible to reduce values of electric resistance and thermal resistance to about a quarter of their original values.

In FIG. 9B, it is possible to change a density of the CNTs 23 in the opening 26a, in accordance with a ratio between an opening diameter A of the upper portion 26a1 of the opening 26a and an opening diameter B of the lower portion 26a2 of the opening 26a. For example, when the ratio of the opening diameter A to the opening diameter B is three to one, the density of the CNTs 23 in the lower portion 26a2 of the opening 26a is increased to about nine times the density of the CNTs 23 in the state of FIG. 6A, namely, it is increased to about $9 \times 10^{12}$ (piece/cm$^2$), resulting in that it becomes possible to reduce values of electric resistance and thermal resistance to about one-ninth of their original values.

Figure 6C:
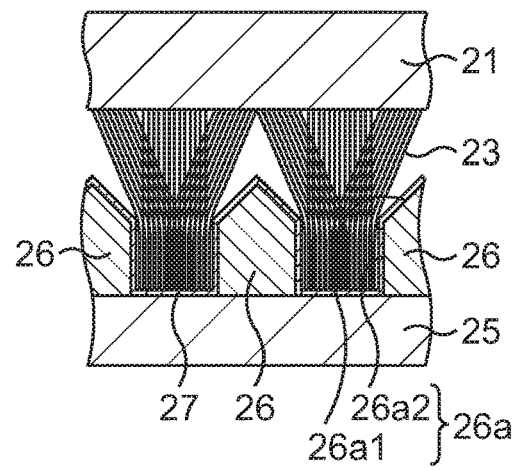
FIG. 6C is a schematic sectional view illustrating the manufacturing method of the conductive structure according to the second embodiment in order of processes continued from FIG. 6B.

Subsequently, a portion between the substrate 25 and the supporting substrate 21 is fixed, as illustrated in FIG. 6C.

Specifically, a SOG 28, for example, is applied to a portion between the substrate 25 and the supporting substrate 21, to thereby fill a gap between the substrate 25 and the supporting substrate 21 using the SOG 28. Consequently, the portion between the substrate 25 and the supporting substrate 21 is fixed by the SOG 28. Note that it is also possible to use, instead of the SOG 28, another insulating material or a metal material excellent in conductivity such as Au or Cu, to thereby fill the gap between the substrate 25 and the supporting substrate 21 by a metal nanoparticle or plating method.

Figure 7A:
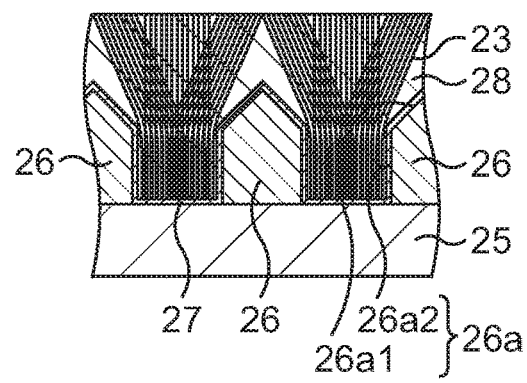
FIG. 7A is a schematic sectional view illustrating the manufacturing method of the conductive structure according to the second embodiment in order of processes continued from FIG. 6C.

Subsequently, the supporting substrate 21 is removed, as illustrated in FIG. 7A.

Specifically, a slicer, a grinder or the like is used to remove the supporting substrate 21.

Figure 7B:
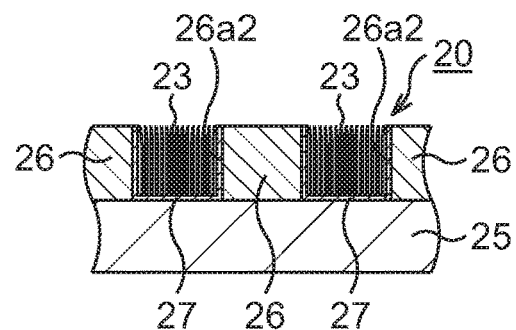
FIG. 7B is a schematic sectional view illustrating the manufacturing method of the conductive structure according to the second embodiment in order of processes continued from FIG. 7A.

Subsequently, surface planarization is performed, as illustrated in FIG. 7B.

Specifically, the catalytic material 22, the CNTs 23, the SOG 28, the base metal film 27, and the insulating film 26 are polished to be planarized in a manner that the lower portions 26a2 of the openings 26a are remained, through the CMP (Chemical-Mechanical Polishing) method, for example.

In the manner as described above, there is formed a conductive structure 20 realized by filling the lower portion 26a2 of the opening 26a of the insulating film 26 with the CNTs 23.

As described above, according to the present embodiment, it is possible to realize the desired conductive structure 20 with high reliability by forming the high-quality CNTs 23 in the lower portion 26a2 of the opening 26a of the insulating film 26 without depending on the base material.

In the conductive structure 20, the CNTs 23 are formed at a density higher than that of the CNTs 23 formed on the supporting substrate 21, resulting in that a conductive structure having further excellent low resistivity, high current density resistance, and high thermal conductivity is realized.

Modified Example

Here, a modified example of the second embodiment will be described. In the present example, a conductive structure and a manufacturing method thereof are disclosed, in a similar manner to the second embodiment, but, the present example is different from the second embodiment in a point that a form of the conductive structure is different.

Figure 10A:
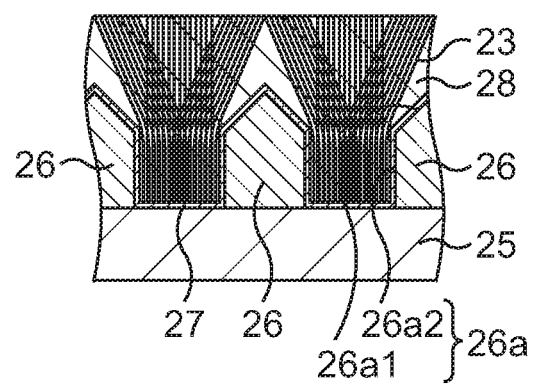
FIG. 10A is a schematic sectional view illustrating main processes in a manufacturing method of a conductive structure according to a modified example of the second embodiment.
Figure 10B:
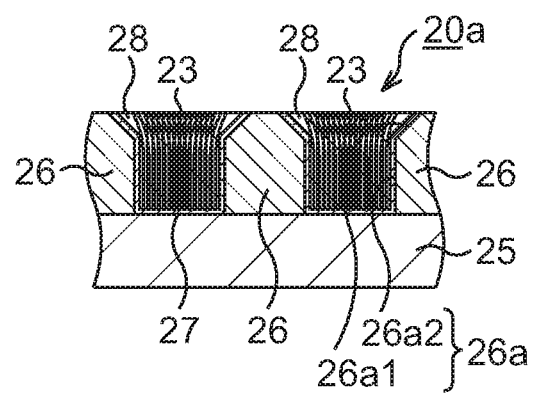
FIG. 10B is a schematic sectional view illustrating the main processes in the manufacturing method of the conductive structure according to the modified example of the second embodiment continued from FIG. 10A.

FIG. 10A and FIG. 10B are schematic sectional views illustrating main processes in the manufacturing method of the conductive structure according to the modified example of the second embodiment. Note that composing members corresponding to those of the second embodiment will be denoted by the same reference numerals, and detailed explanation thereof will be omitted.

In the present example, the respective processes in FIG. 4A to FIG. 7A (including FIG. 8) are first carried out, in a similar manner to the second embodiment. A state corresponding to FIG. 7A is illustrated in FIG. 10A.

Subsequently, surface planarization is performed, as illustrated in FIG. 10B.

Specifically, the catalytic material 22, the CNTs 23, the SOG 28, the base metal film 27, and the insulating film 26 are polished to be planarized in a manner that the lower portions 26a2 and a part of each of the upper portions 26a1 of the openings 26a are remained, through the CMP method, for example. Note that in order to prevent a short-circuit between adjacent conductive structures, it is necessary to divide the base metal film 27 for each conductive structure.

In the manner as described above, there is formed a conductive structure 20a realized by filling the lower portion 26a2 and (a part of) the upper portion 26a1 of the opening 26a of the insulating film 26 with the CNTs 23.

According to the present example, it is possible to realize the desired conductive structure 20a with high reliability by forming the high-quality CNTs 23 in the lower portion 26a2 of the opening 26a of the insulating film 26 without depending on the base material.

In the conductive structure 20a, the CNTs 23 are formed at a density higher than that of the CNTs 23 formed on the supporting substrate 21, resulting in that a conductive structure having further excellent low resistivity, high current density resistance, and high thermal conductivity is realized. Further, in the conductive structure 20a, the upper portion 26a1 is formed to have a dimeter larger than that of the lower portion 26a2. With this configuration, it is possible to form, on the conductive structure 20a, a wiring having a width larger than the opening diameter of the lower portion 26a2, and further, it is possible to obtain a connection of the wiring with the conductive structure 20a more securely. In the conductive structure 20a, the density of the CNTs 23 in the lower portion 26a2 is higher than the density of the CNTs 23 in the upper portion 26a1.

Third Embodiment

In the present embodiment, a case where the conductive structure disclosed in any one of the first embodiment, the second embodiment, and the modified example of the second embodiment, is applied to a contact portion of a MOS transistor, will be disclosed. Here, a case where the conductive structure disclosed in the modified example of the second embodiment is applied to a contact portion of a MOS transistor, will be exemplified. Note that composing members and the like same as the composing members and the like in the modified example of the second embodiment will be denoted by the same reference numerals.

Figure 11:
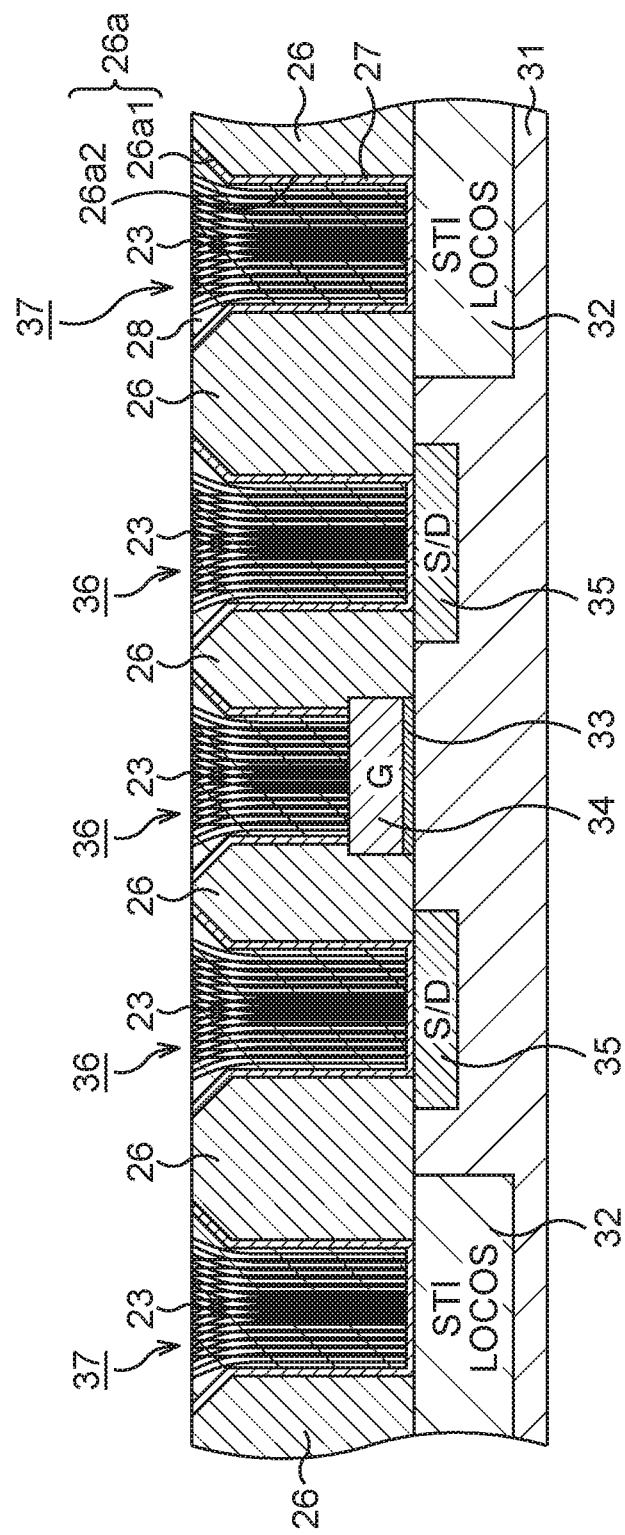
FIG. 11 is a schematic sectional view illustrating a main configuration of a MOS transistor according to a third embodiment.
Figure 12:
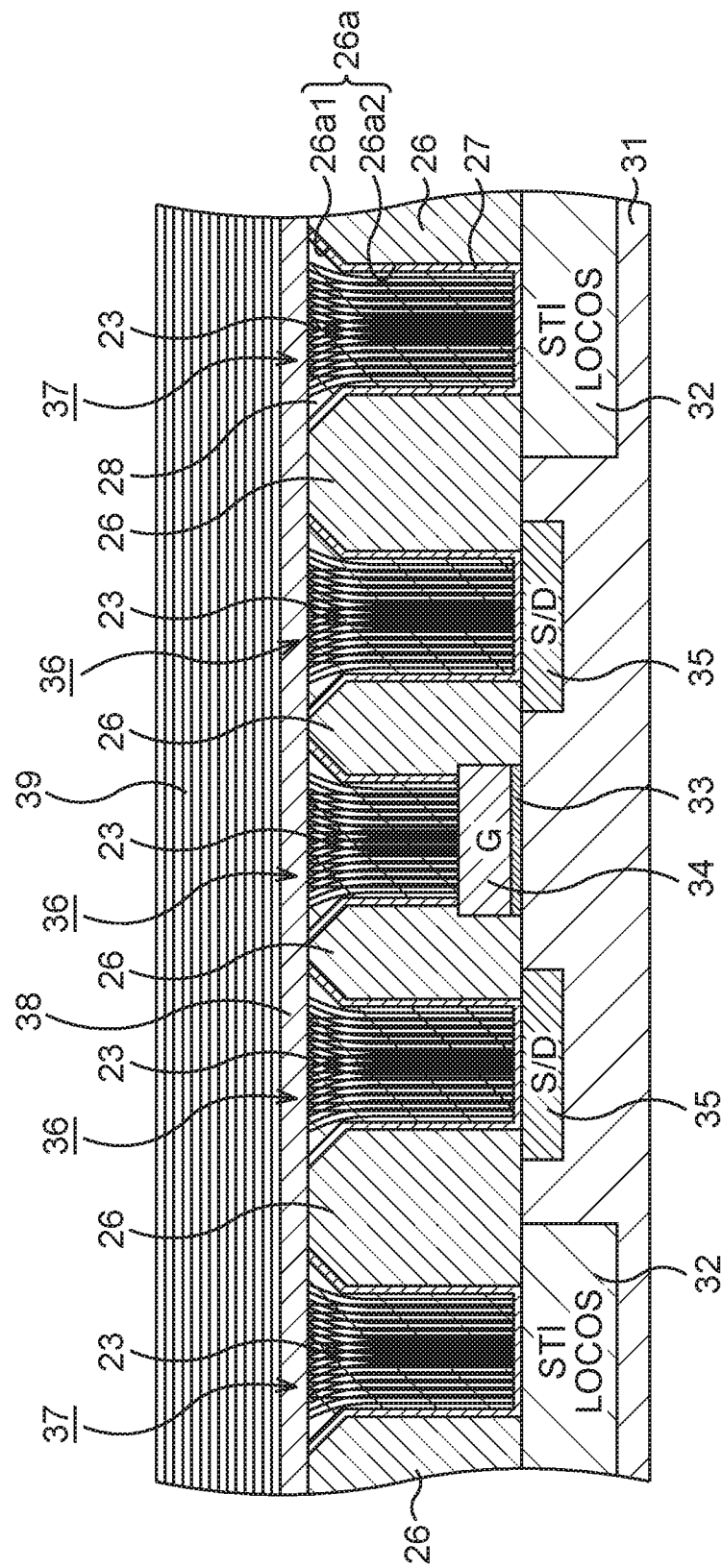
FIG. 12 is a schematic sectional view illustrating the main configuration of the MOS transistor according to the third embodiment continued from FIG. 11.
Figure 13:
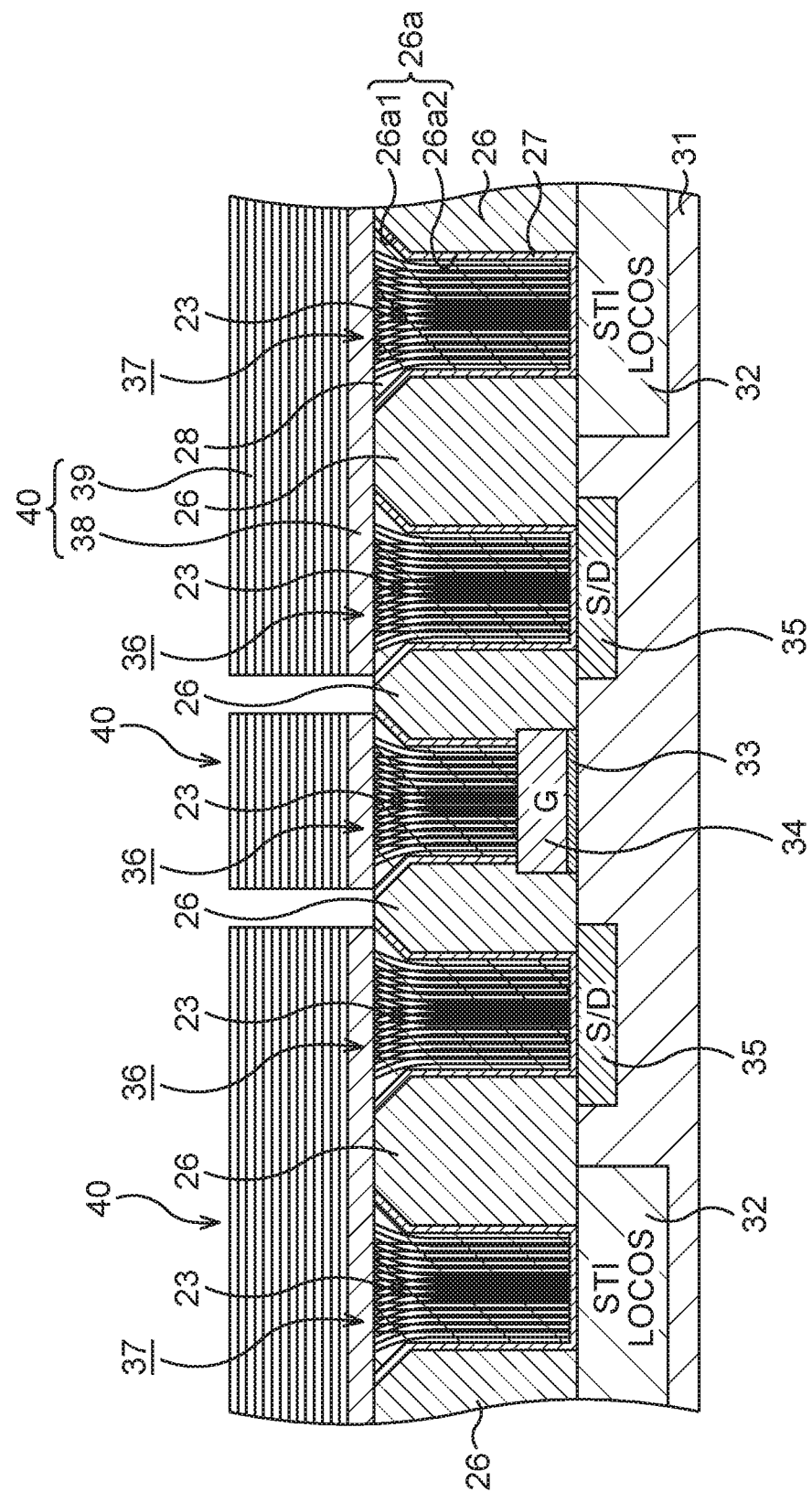
FIG. 13 is a schematic sectional view illustrating the main configuration of the MOS transistor according to the third embodiment continued from FIG. 12.

FIG. 11 to FIG. 13 are schematic sectional views illustrating a main configuration of a MOS transistor according to the third embodiment.

First, contact portions 36 to be connected to a transistor element are formed, as illustrated in FIG. 11.

The transistor element is formed, as a functional element, on a silicon substrate 31.

Specifically, on a surface layer of a Si substrate 31, for example, which corresponds to the substrate 25 in the modified example of the second embodiment, element isolation structures 32 are formed by using, for example, a STI (Shallow Trench Isolation) method, to thereby determine an element active region.

Next, a silicon oxide film, for example, obtained through thermal oxidation or the like is deposited on the element active region by the CVD method, and on the silicon oxide film, a polycrystalline silicon film, for example, is deposited by the CVD method. The polycrystalline silicon film and the silicon oxide film are processed to have a shape of electrode through the lithography and the dry etching followed by the lithography. In the manner as described above, a gate electrode 34 is formed on a gate insulating film 33.

Next, on both sides of the gate electrode 34 in the element active region, impurities of predetermined conductivity type (p type or n type) are ion-implanted. Consequently, source/drain regions 35 are respectively formed on both sides of the gate electrode 34 in the element active region.

The transistor element is formed in the manner as described above.

Next, there are formed the contact portions 36 each of which corresponding to the conductive structure 20a according to the modified example of the second embodiment.

Specifically, the respective processes in FIG. 4A to FIG. 6C, FIG. 10A, and FIG. 10B in the modified example of the second embodiment, are performed in sequence. In the manner as described above, there are formed the contact portions 36 each of which realized by filling the lower portion 26a2 and (a part of) the upper portion 26a1 of the opening 26a of the insulating film 26 with the CNTs 23. The contact portions 36 are conductive structures electrically connecting the gate electrode 34 and the source/drain regions 35 of the transistor element, and a not-illustrated wiring on the contact portions 36.

The present embodiment illustrates a case where, in order to control the CNTs 23 in the opening 26a to have desired state and density, the contact portions 36 are formed, and in addition to that, dummy contact portions 37 having no electrical connection are formed on the element isolation structures 32, for example.

Subsequently, a multilayer graphene 39 is formed via a contact metal 38, as illustrated in FIG. 12.

Specifically, at first, Ti, TiN, or the like is deposited, through the sputtering method or the like, on the whole surface on the contact portions 36 and the dummy contact portions 37, to thereby form the contact metal 38.

Next, a multilayer graphene made by stacking graphene in multiple layers is formed on, for example, a Si substrate through the CVD method or the like, and the multilayer graphene is transferred onto the contact metal 38.

Next, a volatile solvent is applied to the transferred multilayer graphene. As the volatile solvent, acetone, ethanol or the like is used. The applied volatile solvent is dried to make the multilayer graphene come into close contact with the contact metal 38.

In the manner as described above, the multilayer graphene 39 is formed on the contact metal 38.

Subsequently, a lower wiring 40 which is electrically connected to the contact portions 36 is formed, as illustrated in FIG. 13.

Specifically, the contact metal 38 and the multilayer graphene 39 are processed in a shape of wiring through the lithography, the dry etching and the like. In the manner as described above, there is formed the lower wiring 40 realized by being electrically connected to the contact portions 36. The lower wiring 40 is formed also on the dummy contact portions 37.

According to the present embodiment, it is possible to realize the MOS transistor including the desired contact portions 36 with high reliability, by forming the high-quality CNTs 23 in the lower portions 26a2 of the openings 26a of the insulating film 26 without depending on the base material.

Fourth Embodiment

In the present embodiment, a case where the conductive structure disclosed in any one of the first embodiment, the second embodiment, and the modified example of the second embodiment, is applied to a via portion of a MOS transistor and the like, will be disclosed. Here, a case where the conductive structure disclosed in the modified example of the second embodiment is applied to a via portion of a MOS transistor and the like, will be exemplified. Note that composing members and the like same as the composing members and the like in the modified example of the second embodiment will be denoted by the same reference numerals.

Figure 14:
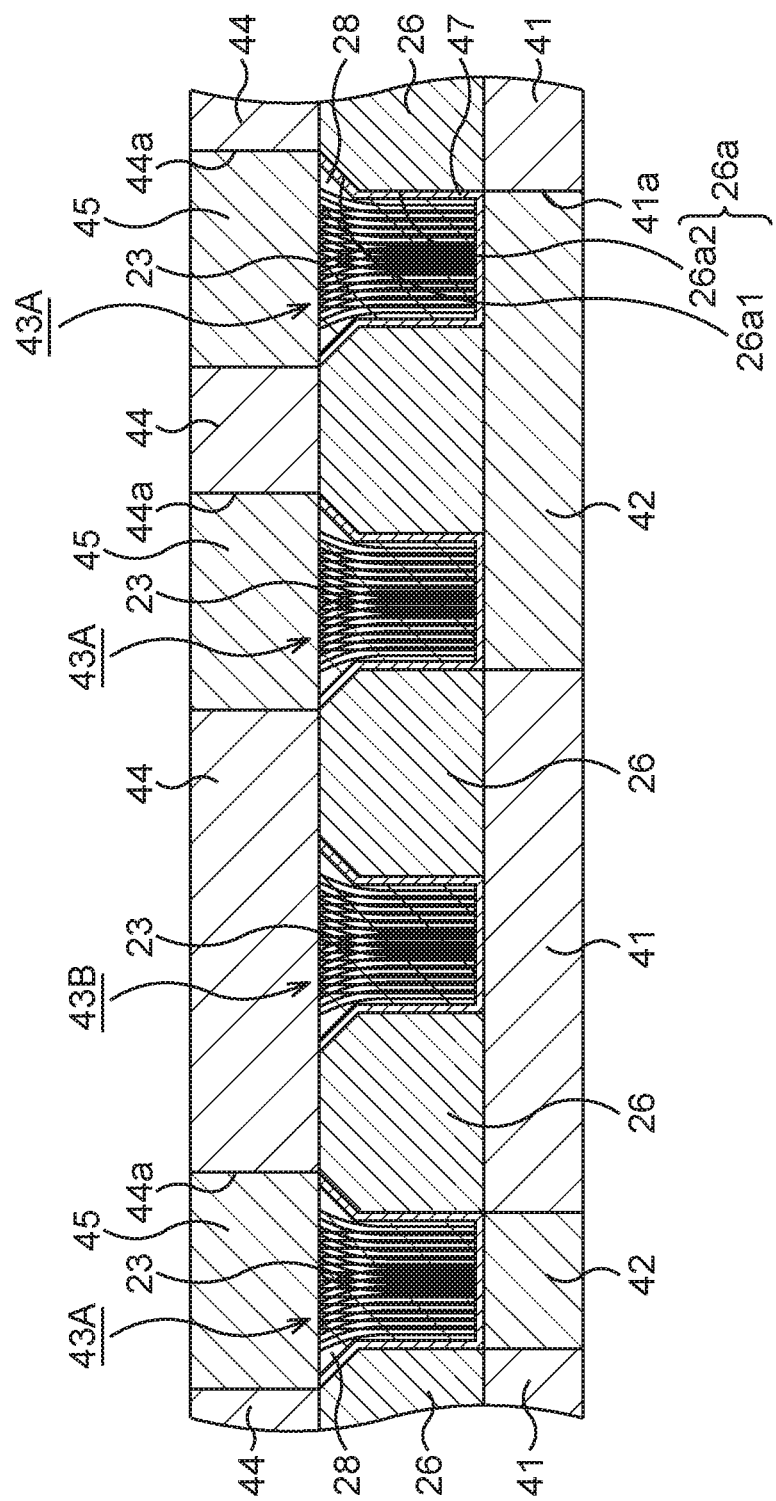
FIG. 14 is a schematic sectional view illustrating a main configuration of a wiring structure including via portions of a MOS transistor and the like according to a fourth embodiment.

FIG. 14 is a schematic sectional view illustrating a main configuration of a wiring structure including via portions of a MOS transistor and the like according to the fourth embodiment.

First, a transistor element of a MOS transistor, for example, is formed, in a similar manner to the third embodiment. In FIG. 14, the illustration of the transistor element is omitted.

Subsequently, a lower wiring 42 which is electrically connected to the contact portions 36 or connected to the dummy contact portions 37 described in the third embodiment, is formed.

The lower wiring 42 is formed by a damascene method, for example. Specifically, an interlayer insulating film 41 is formed, a wiring trench 41a is formed in the interlayer insulating film 41, and after film formation is performed through a plating method, for example, so as to fill the wiring trench 41a with a metal material of copper, copper alloy or the like, the metal material is subjected to polishing and planarization by the CMP. In the manner as described above, there is formed the lower wiring 42 buried in the interlayer insulating film 41.

Subsequently, there are formed via portions 43A and a dummy via portion 43B, each of which corresponding to the conductive structure 20a according to the modified example of the second embodiment.

Specifically, the respective processes in FIG. 4A to FIG. 6C, FIG. 10A, and FIG. 10B in the modified example of the second embodiment, are performed in sequence. In the manner as described above, there are formed the via portions 43A and the dummy via portion 43B each of which realized by filling the lower portion 26a2 and (a part of) the upper portion 26a1 of the opening 26a of the insulating film 26 with the CNTs 23.

Subsequently, there is formed an upper wiring 45 which is electrically connected to the via portions 43A.

The upper wiring 45 is formed by the damascene method, for example. Specifically, an interlayer insulating film 44 is formed on the insulating film 26, a wiring trench 44a is formed in the interlayer insulating film 44 at a portion corresponding to that on the via portion 43A, and after film formation is performed through the plating method, for example, so as to fill the wiring trench 44a with a metal material of copper, copper alloy or the like, the metal material is subjected to polishing and planarization by the CMP. In the manner as described above, there is formed the upper wiring 45 buried in the interlayer insulating film 44. The via portion 43A is formed as a conductive structure which electrically connects between the lower wiring 42 and the upper wiring 45. On the other hand, the dummy via portion 43B has no wirings formed thereon, and thus has no electrical connection.

As described above, there is formed the wiring structure including the lower wiring 42, the via portions 43A (and the dummy via portion 43B), and the upper wiring 45. Note that it is also possible that the lower wiring and the upper wiring which are connected to the via portion 43A are formed by using a multilayer graphene, for example, as a material, instead of using the lower wiring 42 and the upper wiring 45.

According to the present embodiment, it is possible to realize the wiring structure including the desired via portions 43 with high reliability, by forming the high-quality CNTs 23 in the lower portions 26a2 of the openings 26a of the insulating film 26 without depending on the base material.

Fifth Embodiment

In the present embodiment, a case where the conductive structure disclosed in any one of the first embodiment, the second embodiment, and the modified example of the second embodiment, is applied to a TSV (Through-Silicon Via), will be disclosed. Here, a case where the conductive structure disclosed in the modified example of the second embodiment is applied to a TSV, will be exemplified. Note that composing members and the like same as the composing members and the like in the modified example of the second embodiment will be denoted by the same reference numerals.

Figure 15:
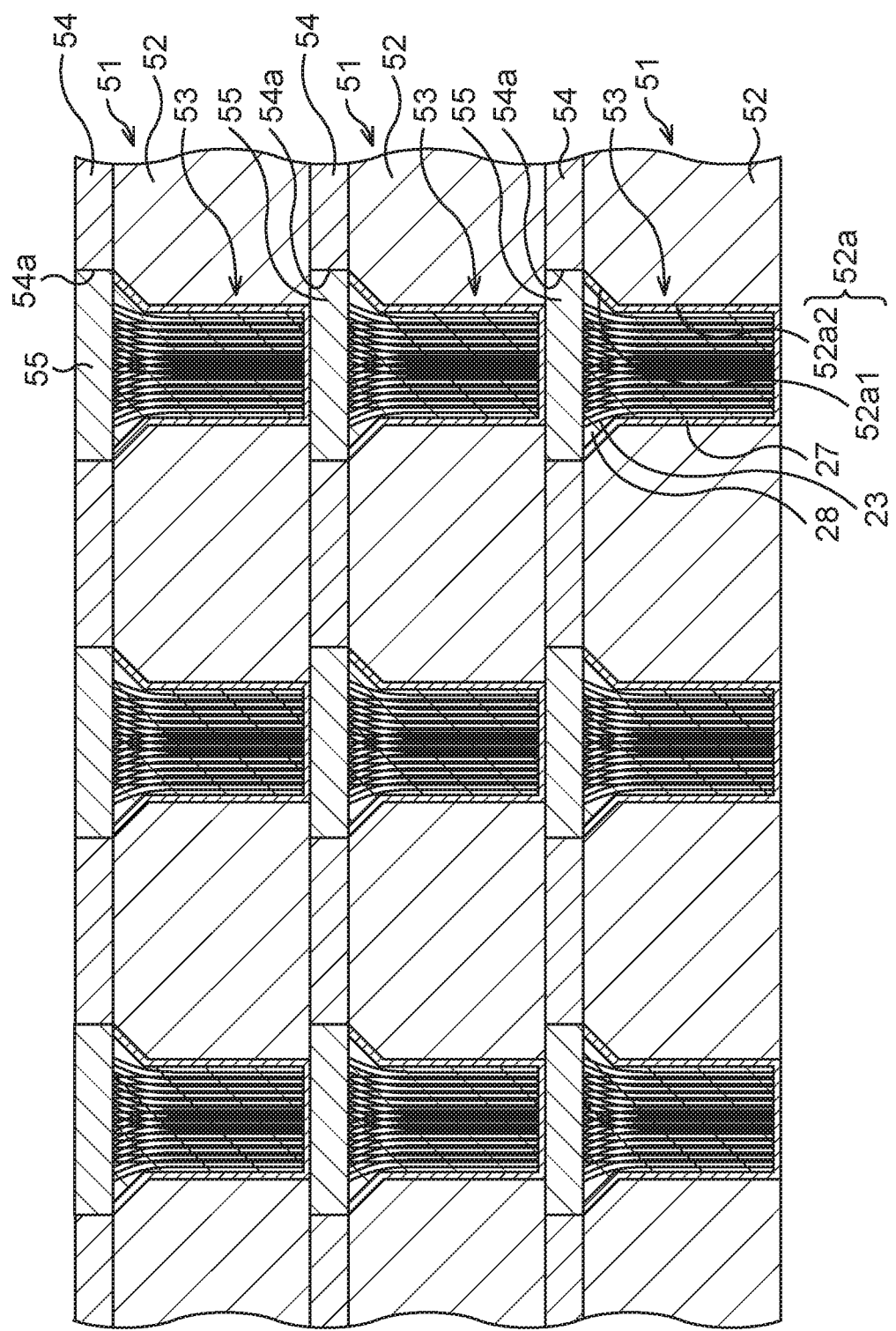
FIG. 15 is a schematic sectional view illustrating a main configuration of a semiconductor device including TSVs according to a fifth embodiment.

FIG. 15 is a schematic sectional view illustrating a main configuration of a semiconductor device including TSVs according to the fifth embodiment.

In the semiconductor device according to the present embodiment, a plurality of (here, three layers of) semiconductor chips 51 are stacked, and in each of the semiconductor chips 51, TSVs 53 are formed in a Si substrate 52, and the respective semiconductor chips 51 are electrically connected via the TSVs 53.

First, there are formed the TSVs 53 each of which corresponding to the conductive structure 20a according to the modified example of the second embodiment.

Here, the Si substrate 52, a through hole 52a, a lower portion 52a2, and an upper portion 52a1 correspond to the insulating film 26, the opening 26a, the lower portion 26a2, and the upper portion 26a1, respectively, in the modified example of the second embodiment.

Specifically, the respective processes in FIG. 4A to FIG. 6C, FIG. 10A, and FIG. 10B in the modified example of the second embodiment, are performed in sequence. In the manner as described above, there are formed the TSVs 53 each of which realized by filling the lower portion 52a2 and (a part of) the upper portion 52a1 of the through hole 52a of the Si substrate 52 with the CNTs 23.

Subsequently, there is formed a wiring 55 which is electrically connected to the TSVs 53.

The wiring 55 is formed by the damascene method, for example. Specifically, an insulating film 54 is formed on the Si substrate 52, a wiring trench 54a is formed in the insulating film 54 at a portion corresponding to that on the TSV 53, and after film formation is performed through the plating method, for example, so as to fill the wiring trench 54a with a metal material of copper, copper alloy or the like, the metal material is subjected to polishing and planarization by the CMP. In the manner as described above, there is formed the wiring 55 buried in the insulating film 54.

In a manner similar to the above, the formation process of the TSVs 53 and the formation process of the wiring 55 are carried out a plurality of times, in the present embodiment, the processes are carried out two times.

In the manner as described above, there is formed the semiconductor device realized by stacking the respective semiconductor chips 51, in which the TSVs 53 of the respective semiconductor chips 51 are electrically connected via the wirings 55. Note that it is also possible that the wiring which is electrically connected to the TSVs 53 is formed by using graphene, for example, as a material, instead of using the wiring 55.

According to the present embodiment, it is possible to realize the semiconductor device including the desired TSVs 53 with high reliability, by forming the high-quality CNTs 23 in the lower portions 52a2 of the openings 52a of the Si substrate 52 without depending on the base material.

According to the present embodiment, it is possible to realize a desired conductive structure with high reliability by forming high-quality CNTs in an opening of a formation site without depending on a substrate material and a base material.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

According to the present embodiment, it is possible to realize a desired conductive structure with high reliability by forming high-quality CNTs in an opening of a formation site without depending on a substrate material and a base material.

What is claimed is:

1. A manufacturing method of a conductive structure, comprising:
   forming an opening in a formation site;
   forming vertical and parallel carbon nanotubes on a substrate;
   transferring the carbon nanotubes to a supporting film, or in a state where the carbon nanotubes are formed on the substrate, facing tip portions of the carbon nanotubes and a surface of the formation site to each other and inserting the tip portions of the carbon nanotubes into the opening from an upper portion of the opening; and
   removing the carbon nanotubes except for the tip portions inserted into the opening.

2. The manufacturing method of the conductive structure according to claim 1, wherein:
   the upper portion of the opening is processed in a tapered state to enlarge an opening diameter; and
   a density of the tip portions of the carbon nanotubes inserted into the opening is higher than a density of portions, other than the tip portions, of the carbon nanotubes.

3. The manufacturing method of the conductive structure according to claim 2, wherein
   when the carbon nanotubes are removed except for the tip portions, the tip portions are filled in the opening having the upper portion.

4. The manufacturing method of the conductive structure according to claim 2, wherein
   after the carbon nanotubes are removed except for the tip portions, a surface layer of the formation site corresponding to the upper portion is subjected to planarization to be removed.

5. The manufacturing method of the conductive structure according to claim 1, wherein
   when the carbon nanotubes are formed, the carbon nanotubes are grown from a surface of the substrate, a mask covering the carbon nanotubes is formed, and the carbon nanotubes are removed up to a predetermined height.

6. The manufacturing method of the conductive structure according to claim 5, wherein
   the mask is formed to cover the carbon nanotubes from lower ends of the carbon nanotubes to the predetermined height, and portions of the carbon nanotubes exposed from the mask are removed.

7. The manufacturing method of the conductive structure according to claim 5, wherein
   the mask is formed to cover all of the carbon nanotubes, and the carbon nanotubes are removed, up to the predetermined height, together with the mask.

8. An electronic device, comprising:
   a functional element formed on a substrate; and
   conductive structures electrically connected to the functional element, wherein
   the conductive structures include:
   a formation site having an opening composed of a lower portion and an upper portion having a taper angle which is larger than that of the lower portion in a tapered state whose opening diameter is larger than that of the lower portion;

a metal film covering an internal surface of the opening; and carbon nanotubes which fill the opening interposing the metal film, wherein the conductive structures are via portions which electrically connect a lower wiring and an upper wiring at a position above the functional element.

9. The electronic device according to claim 8, wherein the lower wiring and the upper wiring are formed by using a graphene.

\* \* \* \* \*